(12) United States Patent  (10) Patent No.: US 9,240,265 B2
Han et al.  (45) Date of Patent: Jan. 19, 2016

(54) METHOD FOR MANUFACTURING GRAIN-ORIENTED ELECTRICAL STEEL SHEET HAVING SUPERIOR MAGNETIC PROPERTY

(75) Inventors: Kyu-Seok Han, Pohang-si (KR); Jae-Soo Lim, Pohang-si (KR); Byung-Deug Hong, Pohang-si (KR); Chan-Hee Han, Pohang-si (KR)

(73) Assignee: POSCO, Pohang-si (FR)

( * ) Notice: Subject to any disclaimer, the term of this patent is extended or adjusted under 35 U.S.C. 154(b) by 266 days.

(21) Appl. No.: 13/823,962

(22) PCT Filed: Dec. 21, 2011

(86) PCT No.: PCT/KR2011/009913
§ 371 (c)(1),
(2), (4) Date: Mar. 15, 2013

(87) PCT Pub. No.: WO2012/087016
PCT Pub. Date: Jun. 28, 2012

(65) Prior Publication Data
US 2013/0180634 A1    Jul. 18, 2013

(30) Foreign Application Priority Data

Dec. 23, 2010   (KR) .................. 10-2010-0133516

(51) Int. Cl.
*C21D 8/12* (2006.01)
*H01F 1/01* (2006.01)
*C22C 38/00* (2006.01)
*C22C 38/06* (2006.01)

(52) U.S. Cl.
CPC .. *H01F 1/01* (2013.01); *C21D 8/12* (2013.01); *C21D 8/1244* (2013.01); *C21D 8/1272* (2013.01); *C22C 38/00* (2013.01); *C22C 38/06* (2013.01); *C21D 2201/05* (2013.01); *C21D 2211/004* (2013.01)

(58) Field of Classification Search
None
See application file for complete search history.

(56) References Cited

U.S. PATENT DOCUMENTS 3,802,937 A    4/1974  Kohler et al.
4,118,255 A    10/1978 Barisoni et al.

FOREIGN PATENT DOCUMENTS

| CN | 1033653 C | 12/1996 |
| EP | 0538519 A1 | 10/1991 |
| EP | 0947596 A1 | 10/1999 |
| EP | 1108794 A1 | 6/2001 |
| EP | 1227163 A1 | 7/2002 |
| EP | 1279747 A2 | 1/2003 |
| EP | 1577405 A1 | 9/2005 |
| EP | 1818420 A1 | 8/2007 |
| JP | 10-204532 | 8/1998 |
| JP | 2000-256810 | 9/2000 |

(Continued)

*Primary Examiner* — Deborah Yee
(74) *Attorney, Agent, or Firm* — The Webb Law Firm

(57) ABSTRACT

Provided is a grain-oriented electric steel sheet and a method for manufacturing same, the steel sheet having superior magnetic properties. The method comprises heating a slab comprising 2.0 to 4.5 weight % of Si, 0.001 to 0.10 weight % of C, 0.010 weight % or lower of Al, 0.08 weight % or lower of Mn, 0.005 weight % or lower of N, 0.002 to 0.050 weight % of S, the remainder being Fe and other unavoidable impurities, performing hot-rolling of the heated slab, performing cold-rolling one time or two or more times including an intermediate annealing, performing decarbonization and re-crystallizing annealing, and performing secondary re-crystallizing annealing.

8 Claims, 1 Drawing Sheet

(a)

(b)

(56) References Cited

FOREIGN PATENT DOCUMENTS

| | | |
|---|---|---|
| JP | 2002-212639 | 7/2002 |
| JP | 2004-169179 | 6/2004 |
| JP | 2007-239009 | 9/2007 |
| JP | 2008-144231 | 6/2008 |
| KR | 0169992 | 10/1998 |
| KR | 20010055101 A | 7/2001 |
| KR | 20010060645 A | 7/2001 |
| KR | 20010062883 A | 7/2001 |
| KR | 20020044243 A | 6/2002 |
| KR | 20020044244 A | 6/2002 |

(a)　　　　　　　　　　　(b)

(a)　　　　　　　　　　　(b)

METHOD FOR MANUFACTURING GRAIN-ORIENTED ELECTRICAL STEEL SHEET HAVING SUPERIOR MAGNETIC PROPERTY

TECHNICAL FIELD

The present invention relates to the manufacture of a grain-oriented electrical steel sheet which is used as a core material in various electrical systems, including large rotating machines such as electric transformers and electric generators, and more particularly to a method of manufacturing a grain-oriented electrical steel sheet having very excellent magnetic properties by forming stable secondary recrystallized grains having the (110)[001] orientation using the primary grain growth inhibitory effect of grain boundary segregation of elementary S and FeS precipitates and reducing the amount of Al-based precipitates and oxides in a secondarily recrystallized steel sheet, and to a grain-oriented electrical steel sheet having excellent magnetic properties, manufactured by this method.

BACKGROUND ART

A grain-oriented electrical steel sheet is a soft magnetic material having very excellent magnetic properties in the rolling direction as a result of the so-called Goss texture, in which all the grains of the steel are oriented in the (110) direction and the crystallographic orientation in the rolling direction is parallel to the [001] axis. Generally, magnetic properties can be expressed as magnetic flux density and core loss, and high magnetic flux density can be obtained by arranging grains in the (100)[001] orientation. An electrical steel sheet having high magnetic flux density can contribute to reducing the size of the core material of an electrical system and also has a low hysteresis loss, and thus can contribute to a decrease in the size and an increase in the efficiency of an electrical device. As used herein, the term "core loss" refers to the loss of power consumed as heat energy when an alternating magnetic field is applied to a steel sheet. The core loss of a steel sheet greatly changes depending on the magnetic flux density and thickness of the steel sheet, the amount of impurities in the steel sheet, and the resistivity and recrystallized grain size of the steel sheet. As the magnetic flux density and resistivity of a steel sheet increase and the thickness and impurity content of the steel sheet decrease, the core loss decreases, resulting in an increase in the efficiency of an electrical device comprising the steel sheet.

Currently, in order to combat global warming worldwide by reducing the generation of $CO_2$, the development of energy-saving and high-efficiency products is ongoing, and as the demand for highly efficient electrical devices that use a reduced amount of electrical energy increases, the demand for grain-oriented electrical steel sheets having low core loss properties increases.

Generally, a grain-oriented electrical steel sheet having excellent magnetic properties should have a strong Goss texture having the (110)[001] orientation, which is formed in the rolling direction of the steel sheet, and in order to form this Goss texture, Goss-oriented grains should grow into abnormal grains which are secondary recrystallized grains. Unlike conventional grain growth, this abnormal grain growth occurs when the migration of grains that normally grow is inhibited by precipitates, inclusions, or elements which form a solid solution or segregate to the grain boundaries. Such precipitates or inclusions that inhibit grain growth are specifically called "grain growth inhibitors," and studies on the technology of manufacturing grain-oriented electrical steel sheets having the (110)[001] orientation by secondary recrystallization have been focused on ensuring excellent magnetic properties by forming secondary recrystallized grains having high (110)[001] orientation using a strong grain growth inhibitor.

Initially developed grain-oriented electrical steel sheets were manufactured by a two-step cold rolling process using MnS as a grain growth inhibitor as proposed by M. F. Littman. In this process, secondary recrystallized grains were stably formed, but the magnetic flux density of the steel sheet was not sufficiently high and the core loss was undesirably high.

Since then, Taguchi and Sakakura have proposed a method of manufacturing a grain-oriented electrical steel sheet by one-step cold rolling at a cold rolling ratio of 80% or higher using a combination of AlN and MnS precipitates.

Recently, Japanese Patent Publication Nos. Hei 1-230721 and 1-283324 disclose a method for manufacturing a grain-oriented electrical steel sheet, which comprises cold-rolling a steel sheet once without using MnS, decarburizing the cold-rolled steel, and subjecting the decarburized steel sheet to secondary recrystallization using an Al-based nitride exhibiting a strong effect of inhibiting grain growth, in which the secondary recrystallization is caused by introducing nitrogen into the steel sheet in a separate nitrification process using ammonia gas.

Until now, almost all steel manufacturing companies that manufacture grain-oriented electrical steel sheets have used a manufacturing method in which precipitates such as AlN or MnS[Se] are mainly used as grain growth inhibitors to cause secondary recrystallization.

This method for manufacturing a grain-oriented electrical steel sheet using an AlN or MnS precipitate as a grain growth inhibitor has an advantage in that stable secondary recrystallization can be induced, but the precipitates should be very finely and uniformly distributed in the steel sheet to exhibit a strong effect of inhibiting grain growth. In order to uniformly distribute the fine precipitates as described above, a slab should be heated to a temperature of 1,300° C. or higher for a prolonged period of time before hot rolling so that coarse precipitates present in the steel are dissolved to form a solid solution, and then within a very short time, the steel should be hot-rolled before precipitation occurs. For this purpose, a large-scale slab heating system is required, and for the maximal inhibition of precipitation, hot rolling and coiling processes should be very strictly managed, and a process of annealing the hot-rolled sheet should be managed such that the solid solution is finely precipitated. In addition, when the slab is heated to a high temperature, $Fe_2SiO_4$ having a low melting point will be formed, resulting in slab washing, thus reducing the yield of the steel sheet.

In addition to the above-described problems, in the grain-oriented electrical steel sheet manufacturing method in which secondary recrystallization is caused using an AlN or MnS precipitate as a grain growth inhibitor, purification annealing should be carried out at a temperature of 1,200° C. or higher for hours or longer after completion of secondary recrystallization, in order to remove precipitates. This purification annealing complicates the manufacturing process and increases the manufacturing cost.

In other words, when precipitates such as AlN or MnS remain in the steel sheet after causing secondary recrystallization using the precipitates as grain growth inhibitors, they interfere with the movement of magnetic domains to increase the hysteresis loss. For this reason, the precipitates should necessarily be removed. Thus, after completion of secondary recrystallization, refinement annealing is carried out using 100% hydrogen gas at a high temperature of about 1,200° C.

for a prolonged period of time to remove precipitates such as AlN and MnS, as well as other impurities. In this purification annealing, the MnS precipitate is separated into Mn and S, and the separated Mn is dissolved in the steel, and the separated S diffuses to the surface of the steel and reacts with atmospheric hydrogen gas to form $H_2S$, which is discharged.

In recently developed technology for manufacturing a grain-oriented electrical steel sheet using a low-temperature slab heating method that forms secondary recrystallized grains by AlN-based precipitates resulting from nitrification after decarburization annealing following cold rolling, a slab is heated at a temperature of 1,200° C. or lower in order to overcome problems such as difficulty in the operation of a slab heating system and a decrease in yield in the hot rolling step. However, in this method, purification annealing should also be carried out at a high temperature of 1,200° C. or higher for 30 hours or longer after completion of secondary recrystallization in order to remove the components of the AlN precipitates, and this purification annealing complicates the manufacturing process and increases the manufacturing cost.

In this purification annealing process, the AlN-based precipitate is separated into Al and N, after which the separated Al migrates to the surface of the steel sheet and reacts with oxygen on the surface to form an $Al_2O_3$ oxide. The formed Al-based oxide or the AlN precipitates which are not separated in the purification annealing process interfere with the movement of magnetic domains in the steel sheet or portions close to the steel sheet surface to increase the core loss.

Thus, in order to improve the magnetic properties of a grain-oriented electrical steel sheet and reduce the dependence of the steel sheet on purification annealing to increase the steel sheet productivity, new technology for manufacturing a grain-oriented electrical steel sheet, which does not use precipitates such as AlN or MnS as grain growth inhibitors, is required.

Methods for manufacturing a grain-oriented electrical steel sheet without using an AlN or MnS precipitate as a grain growth inhibitor include a method of preferentially growing grains in the (110)[001] orientation using surface energy as the grain growth driving force as disclosed in Japanese Patent Laid-Open Publication Nos. Sho 64-55339 and Hei 2-57635. This method is based on the finding that grains present on the steel sheet surface have surface energy that is different between crystallographic orientations and that (110)-oriented grains having the lowest surface energy grow while encroaching other grains having higher surface energy. This method has a problem in that the thickness of the steel sheet should be thin so that this difference in surface energy is effectively used. Japanese Patent Laid-Open Publication No. Sho 64-55339 discloses a steel sheet thickness of 0.2 mm or smaller, and Japanese Patent Laid-Open Publication No. Hei 2-57635 discloses a steel sheet thickness of 0.15 mm or smaller. In the methods disclosed therein, a grain-oriented electrical steel sheet having excellent magnetic properties can be manufactured only under the condition in which the steel sheet thickness is very small as described above. However, the thickness of grain-oriented electrical steel sheets which are widely used to manufacture electrical transformers is 0.23 mm or larger, and at a product thickness larger than 0.23 mm, there is technical difficulty in forming secondary recrystallized grains using surface energy. Further, the technology employing surface energy has a problem in that a high load acts on a hot rolling process when a steel sheet has a thickness of 0.20 mm or smaller is manufactured. In addition, in order to effectively use surface energy, secondary recrystallization should be performed in a state in which the production of oxide on the steel sheet surface is inhibited as much as possible. For this reason, a high-temperature annealing atmosphere should necessarily be a mixed gas atmosphere of inert gas and hydrogen gas. In addition, because no oxide layer is formed on the steel sheet surface, it is impossible to form an $Mg_2SiO_4$ (forsterite) layer in a high-temperature annealing process for forming secondary recrystallized grains, and thus insulation of the steel sheet is difficult and the core loss increases.

Meanwhile, Japanese Patent Laid-Open Publication No. 2000-129356 discloses a method for manufacturing a grain-oriented electrical steel sheet, in which secondary recrystallized grains are formed by minimizing the content of impurities in the steel sheet without the use of precipitates to maximize the difference in the grain boundary mobility of grains between crystallographic orientations. This patent document suggests that the Al content is inhibited to 100 ppm or less and the contents of B, V, Nb, Se, S, P and N are inhibited to 50 ppm or less, but the examples of the patent document describe that a small amount of Al forms precipitates or inclusions to stabilize secondary recrystallized grains. Thus, the method disclosed in the above patent document does not appear to be a method for manufacturing a grain-oriented electrical steel sheet, which completely excludes the use of precipitates, and the magnetic properties of the steel sheet manufactured by the method are inferior to those used to manufacture commercially available, grain-oriented electrical steel sheets. In addition, even though the low core loss properties of the steel sheet are ensured by minimizing the content of impurities in the steel sheet, problems such as low productivity and increased manufacturing costs are not solved.

In addition, there was an attempt to use various precipitates such as TiN, VN, NbN or BN as grain growth inhibitors, but stable secondary recrystallized grains could not be formed due to thermal instability and the excessively high decomposition temperature of precipitates.

PRIOR ART DOCUMENTS

Patent Documents (Patent Document 1) JP1989-230721 A
(Patent Document 2) JP1989-283324 A
(Patent Document 3) JP1989-055339 A
(Patent Document 4) JP1990-057635 A
(Patent Document 5) JP2000-129356 A It is an object of the present invention to provide a new technology for manufacturing a grain-oriented electrical steel sheet having a very low core loss in an inexpensive and effective manner, in which elementary S, which segregates to grain boundaries, and FeS precipitates, are used as main grain growth inhibitors without using AlN or MnS precipitates so as to improve the magnetic properties and productivity of the steel sheet, and in which grain growth inhibitory effects of grain boundary segregation of elementary S and FeS precipitates are used to form stable secondary recrystallized grains having the (110)[001] orientation while the amount of Al-based precipitates and oxides in the steel sheet after completion of secondary recrystallization is minimized.

SUMMARY OF THE INVENTION

In order to accomplish the above object, the present invention provides a method for manufacturing a grain-oriented electrical steel sheet having excellent magnetic properties, the method comprising: heating a slab comprising 2.0-4.5 wt % of Si, 0.001-0.10 wt % of C, 0.010 wt % or less of Al, 0.08 wt % or less of Mn, 0.005 wt % or less of N, 0.002-0.050 wt % of S, and the balance of Fe and unavoidable impurities; hot-rolling the heated slab; subjecting the hot-rolled steel sheet to one cold rolling or two or more cold rollings with intermediate annealing therebetween; subjecting the cold-rolled steel sheet to decarburization and recrystallization annealing; and subjecting the annealed steel sheet to secondary recrystallization annealing.

The slab preferably contains 0.05 wt % or less of Mn and 0.005 wt % or more of S.

Further, the inventive method for manufacturing the grain-oriented electrical steel sheet preferably comprises annealing the hot-rolled steel sheet after the hot rolling, but before the cold rolling.

In addition, the secondary recrystallization annealing is preferably performed by heating the decarburized and recrystallized steel sheet to a temperature of 1,000° C. or higher to cause secondary recrystallization of the steel sheet, and then subjecting the steel sheet to homogenization heat treatment at a temperature of 1000° C. within 10 hours, preferably within 1 hour.

In the inventive method for manufacturing the grain-oriented electrical steel sheet, the secondary recrystallization is preferably caused by inhibiting grain growth using at least any one of elementary S, which segregates to grain boundaries, and an FeS precipitate, in the secondary recrystallization annealing.

The inventive grain-oriented electrical steel sheet having excellent magnetic properties comprises 2.0-4.5 wt % of Si, 0.003 wt % or less of C, 0.010 wt % or less of Al, 0.08 wt % or less of Mn, 0.005 wt % or less of N, 0.0005-0.050 wt % of S, and the balance of Fe and unavoidable impurities, and was subjected to secondary recrystallization using at least any one of grain boundary-segregated elementary S and an FeS precipitate as a grain growth inhibitor.

In addition, the grain-oriented electrical steel sheet of the present invention has an Al oxide density of $0.1-500/mm^2$ in the thickness-directional cross-section of the secondarily recrystallized steel sheet, and a coercivity of 30 A/m or less under an alternating magnetic field of 1.7 Tesla at 50 Hz.

Advantageous Effects

According to the present invention, a grain-oriented electrical steel sheet having a very low core loss can be manufactured in an expensive and efficient manner by minimizing the contents of Al, which forms Al-based oxides precipitates, N, and Mn, which form MnS precipitates, in a steel making step, while causing secondary recrystallization using grain boundary-segregated elementary S and FeS precipitates as grain boundary inhibitors required for formation of secondary recrystrallized grains, and reducing the amount of Al-based precipitates and oxides in the secondarily recrystallized steel sheet to minimize interference with the movement of magnetic domains.

DETAILED DESCRIPTION OF THE INVENTION

Figure 1:
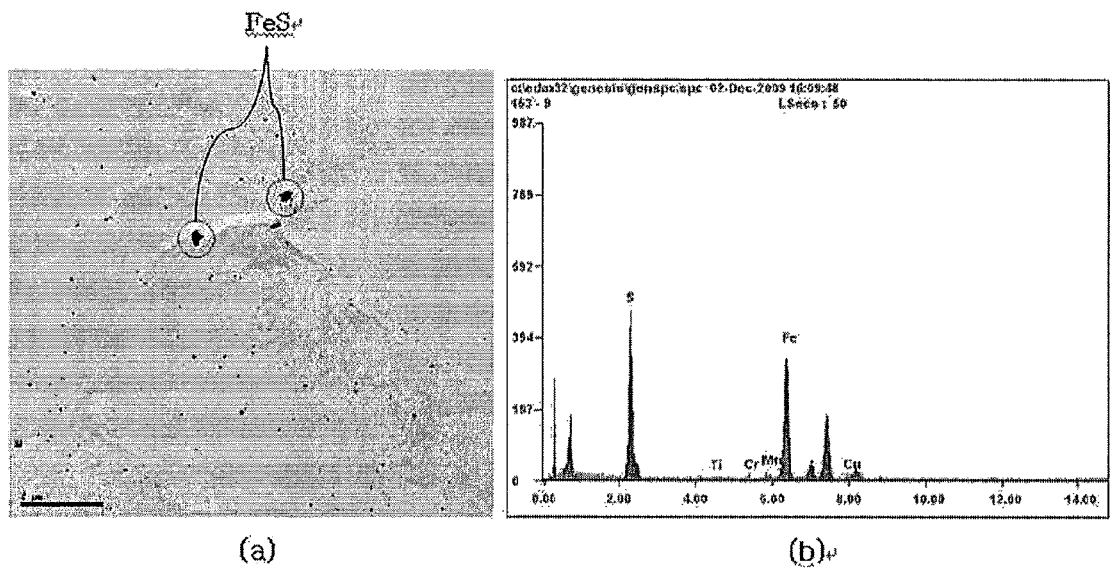
FIG. 1(a) is a transmission electron microscope (TEM) photograph of the thickness-directional cross-section of a grain-oriented electrical steel sheet (inventive material 3 in Table 1) according to the present invention and shows FeS precipitates in grain boundaries.
FIG. 1(b) is a graph showing the results of analyzing the components of a grain-oriented electrical steel sheet (inventive material 3 in Table 1) of the present invention by EDS (Energy Dispersive Spectroscopy).

Hereinafter, the present invention will be described in detail.

In conventional technology for manufacturing grain-oriented electrical steel sheets, precipitates such as AlN or MnS are used as grain growth inhibitors, all the processes are restricted such that the distribution of the precipitates is strictly controlled and precipitates remaining in secondarily recrystallized steel sheets are removed.

Accordingly, the present inventors paid attention to the fact that, if stable secondary recrystallization can be caused without using AlN or MnS precipitates as grain growth inhibitors, conventional processes for manufacturing grain-oriented electrical steel sheets can be significantly simplified. Based on this fact, the present inventors have conducted studies on a method for manufacturing a grain-oriented electrical steel sheet having excellent magnetic properties using various alloying elements, impurities, and precipitates thereof as grain growth inhibitors.

As described above, through long-term studies on a new technology for manufacturing a grain-oriented electrical steel sheet, which does not use AlN or MnS as grain growth inhibitors, the present inventors have newly found that a grain-oriented electrical steel sheet having a very low core loss can be developed by causing stable secondary recrystallization in the (110)[001] orientation through the inhibition of grain growth using the grain boundary segregation of elementary S together with the use of FeS precipitates while minimizing the amount of Al precipitates and oxides in the steel sheet after final high-temperature annealing.

Specifically, in order to examine the influence of grain boundary segregation elements on grain growth, the present inventors vacuum-melted ingots, which have various contents of the grain boundary segregation element S without containing precipitate-forming elements, and examined the possibility of secondary recrystallization of the melted ingots. As a result, the present inventors could found that, when a suitable amount of S was added while limiting the addition of Mn, stable secondary recrystallized grains having the (110)[001] orientation were formed, and a low core loss of 0.95 W/kg or less together with a magnetic flux density of 1.90 Tesla or more was ensured.

In addition, the present inventors found that, when a component system containing a specific amount of S without containing elements forming AlN or MnS precipitates was used, the frequency of generation of Al-containing precipitates and oxides in the secondarily recrystallized steel sheet was significantly reduced compared to the frequency of generation of Al-containing precipitates and oxides in a component system containing conventional AlN-based precipitates, suggesting that the core loss properties in this case are excellent compared to when conventional AlN-based precipitates are used as grain growth inhibitors.

It is already known that S is a grain boundary segregation element. Because S segregates to the center of grains in a solidification process to promote cracking during deformation, carbon is generally used in the manufacture of grain-oriented electrical steel sheets so that S is uniformly distributed without segregating to the center. In addition, S reacts with about 0.08-0.2 wt % of Mn in a general process for manufacture of a grain-oriented electrical steel sheet to form MnS precipitates, and the formed MnS precipitates act as grain growth inhibitors to refine the grain size.

However, as described above, there are problems in that a slab should be heated to a temperature of 1300° C. or higher in order to finely and uniformly distribute MnS precipitates and in that the steel sheet should be annealed at a temperature of 1200° C. or higher for a prolonged period of time after secondary recrystallization and high-temperature annealing so that coarse MnS can be decomposed.

In order to overcome the above-described problems, according to the present invention, the content of Mn is minimized so that little or no MnS precipitates are formed, whereby elementary S segregates to grain boundaries or FeS precipitates are formed to maximally inhibit the growth of grains, thereby forming secondary recrystallized grains having the (110)[001] orientation.

Accordingly, in the present invention, grain growth is inhibited by the grain boundary segregation of elementary S and the use of FeS precipitates without using precipitates such as AlN or MnS, a slab does not need to be heated at high temperature for a long time in order to dissolve AlN or MnS precipitates, and nitrification for providing additional inhibition after decarburization annealing is not required, suggesting that complicated processes can be omitted. In addition, FeS has a very low melting point of 1194° C., which makes it possible to reduce the temperature of initiation of second recrystalllization in the (110)[001] orientation to 1000° C. or lower, and the decomposition of FeS and the discharge of S are very easily achieved by purification annealing at a temperature of 1200° C.

Hereinafter, the reasons for the limitation of components in the present invention will be described.

Si is the basic component of the electrical steel sheet and functions to increase the resistivity of the material to reduce the core loss. If the Si content is less than 2.0 wt %, the resistivity of the material will be reduced so that the core loss properties will be deteriorated, and secondary recrystallized grains will become unstable due to the presence of a phase transformation zone in high-temperature annealing. If the Si content is higher than 4.5 wt %, the brittleness of the steel will become greater, making cold rolling difficult, and the content of C for providing an austenite content of 40% or higher will greatly increase, and the formation of secondary recrystallized grains will be unstable. For these reasons, the Si content is limited to 2.0-4.5 wt %.

Al reacts with nitrogen in steel to form AlN precipitates. For this reason, in the present invention, the Al content is limited as much as possible to avoid the formation of Al-based nitrides or oxides. If the content of acid-soluble Al is more than 0.010%, the formation of AlN and $Al_2O_3$ will be promoted, and an increase in the purification annealing time for removing AlN and $Al_2O_3$ will be required. In addition, oxides such as $Al_2O_3$ remain in the final product to increase the coercivity and core loss of the product. For these reasons, the content of acid-soluble Al in the steel making step is limited to 0.010% or less.

The present inventors measured the density of Al-based oxides in the final grain-oriented electrical steel sheet product as a function of the Al content in the steel making step. As a result, it was found that, when the Al content was higher than 0.01 wt %, the density of Al-based oxides was higher than 500/mm², and the core loss of the steel also showed a tendency to increase rapidly. Thus, in order to reduce the density of Al-based oxides to 500/mm² or less, it is required to reduce the Al content to 0.01% or less. Decreasing the density of Al-based oxides to the lowest possible level has a positive effect on the core loss of the final product, and the density of Al-based oxides is preferably controlled to 0.1-500/mm² through process control.

Mn has the effect of increasing the resistivity of steel to reduce the core loss in the same manner as Si, but the main object of addition of Mn as mentioned in the prior patent documents was to form MnS precipitates by reaction with S in steel to thereby inhibit grain growth. However, in the present invention, the content of Mn is preferably limited as much as possible, because the grain growth inhibitory effect is obtained only by the grain boundary segregation of elementary S or the use of FeS precipitates. It is ideal that no Mn be added, but when Mn is unavoidably added in the steel making process, the amount of Mn added is preferably limited to 0.08 wt % or less.

If the amount of Mn added is more than 0.08 wt %, coarse MnS precipitates will be formed, and thus the effect of grain boundary segregation of elementary S will be reduced and the precipitation of FeS will also be difficult. In addition, the decomposition of MnS in a subsequent purification annealing process will require a large amount of time, and MnS will remain as precipitates in the final product to increase the core loss. For these reasons, the content of Mn is preferably limited to 0.08% or less, and more preferably 0.05% or less.

N is an element that reacts with Al to form AlN and $Si_3N_4$ precipitates. For this reason, the content of acid-soluble Al is limited as much as possible to inhibit the formation of AlN. $Si_3N_4$ can influence grain growth, but $Si_3N_4$ precipitates have a decomposition temperature of about 800° C. and do not greatly influence the formation of secondary recrystallized grains caused by the grain boundary segregation of S. However, if the content of N is high, N reacts with Al in steel to form AlN or segregates to grain boundaries to influence the grain boundary segregation of S. For these reasons, the content of N is preferably limited to 0.005% or less in the steel making step.

C is an austenite-stabilizing element that causes phase transformation at a temperature of 900° C. or higher to refine coarse columnar structures, which occur in a continuous casting process, and inhibit the segregation of S to the slab. In addition, C promotes the work hardening of the steel sheet during cold rolling to promote the nucleation of secondary recrystallized grains having the (110)[001] orientation in the steel sheet. Thus, there is no special limitation on the amount of C added, but if C is added in an amount of less than 0.001 wt %, the phase transformation and work hardening effects cannot be obtained, and if C is added in an amount of more than 0.1 wt %, it will cause edge cracks during hot rolling, making the hot rolling operation difficult, and will also cause a load to be applied in a decarburization annealing process after cold rolling. For these reasons, the amount of C added is preferably 0.001-0.1 wt %.

S is the key element in the present invention, and it segregates to grain boundaries and, at the same time, forms FeS precipitates at the grain boundaries to strongly inhibit the movement of the grain boundaries, thereby enabling secondary recrystallization in the (110)[001] orientation. Preferably, S is added in an amount of 0.002-0.05 wt % so that it is present alone or forms FeS. However, when Mn is unavoidably incorporated, S is especially preferably added in an amount of 0.005 wt % in the steel making step so that the content of S remaining after formation of MnS is at least 0.002 wt %. For these reasons, S is added in an amount of 0.002-0.05 wt %, and more preferably in an amount of 0.005-0.05 wt %.

If S is added in an amount of less than 0.002% or if the amount of elementary S present without reaction with Mn is less than 0.002 wt %, the grain growth inhibitory effect of the grain boundary segregation of elementary S or the use of FeS precipitates will be insufficient, and if S is added in an amount of more than 0.05 wt %, edge cracks will occur due to red brittleness in the hot-rolling step, making the hot-rolling operation difficult.

In addition, when S is added in an amount of 0.005-0.05 wt % in the steel making step, S will remain in the final product, and the content of S in the final product will be 0.0005 wt % or more. S reacts with $H_2$ atmosphere gas in the final annealing process after secondary recrystallization to form $H_2S$ gas which is naturally removed from the steel sheet, but it is not removed in large amounts and partially remains in the steel sheet depending on a high-temperature annealing process, unlike a conventional annealing process which is carried out at 1200° C. for a prolonged period of time. S that remains as described above is present mainly at grain boundaries and does not adversely affect the magnetic properties of the final product. This property of S is an important factor that makes the present invention possible. The content of S in the final product is at least 0.0005 wt %, and the upper limit of the content range of S in the final product is not specifically limited because it varies depending on a high-temperature annealing process.

In addition to the above-described alloying elements, other alloying elements may also be used in the present invention, as long as they do not adversely affect the grain growth inhibitory effect of the grain boundary segregation of S or the use of FeS precipitates.

Hereinafter, the inventive method for manufacturing a grain-oriented electrical steel sheet having excellent magnetic properties will be described.

In the steel making step, it is required to minimize the content of Al that is an AlN precipitate-forming element, and the precipitation of MnS should be maximally inhibited to increase the formation of elementary S or FeS, which is required in the present invention. For this reason, the content of Mn is also required to be limited to the lowest possible level. In addition to the addition of Si for increasing resistivity, C for making structures uniform, and S required for the inhibition of grain growth, alloying elements advantageous for the formation of (110)[001] Goss textures may be added if necessary. The molten steel whose components have been controlled in the steel making step is continuously cast to produce a slab.

The slab is then heated at a temperature set so as not to interfere with the heating of other steel slabs. Thus, the slab is preferably heated at a temperature between 1050° C. and 1280° C.

After the slab has been heated at a predetermined temperature, it is hot-rolled. The slab can be hot-rolled to produce a hot-rolled sheet having a thickness of 1.5-4.0 mm so that it can be cold-rolled to a reduction ratio of 50-90% in a final cold rolling step.

The hot-rolled sheet is cold-rolled, after it has been annealed, if necessary. When the annealing of the hot-rolled sheet is performed, the hot-rolled sheet is heated to a temperature of 900° C. or higher, subjected to homogenization heat treatment for a suitable time, and then cooled, in order to make the hot-rolled structure uniform.

Then, the hot-rolled sheet is subjected to one rolling or two or more rollings with intermediate annealing therebetween using a reverse rolling mill or a tandem rolling mill so as to produce a cold-rolled sheet having a final thickness. During the cold rolling, a warm rolling process of maintaining the temperature of the steel sheet at 100° C. or higher is advantageously performed in order to improve the magnetic properties of the steel sheet.

After completion of the cold rolling, decarburization and recrystallization annealing is performed. In the decarburization and recrystallization annealing, the steel sheet is maintained at a temperature of 750° C. or higher for 30 seconds or longer so that it is easily decarburized. In this case, the carbon content of the steel sheet can be reduced to about 0.0030 wt % or less while a suitable amount of an oxide layer is formed on the steel sheet surface. The cold-rolled structure deformed by decarburization and recrystallization annealing is recrystallized, and the grains thereof grow to a suitable size. Herein, the decarburization annealing temperature and the heat treatment time may be controlled so that the recrystallized grains can grow to 5 μm or greater.

After the decarburization and recrystallization annealing has been performed, the steel sheet is coated with an annealing separator such as MgO and subjected to secondary recrystallization annealing. In the secondary recrystallization annealing, the steel sheet is heated at a suitable rate to cause secondary recrystallization of the (110)[001] Goss texture. Then, the steel sheet is subjected to purification annealing to remove impurities, followed by cooling. In the secondary recrystallization annealing process, the steel sheet may be heat-treated using a mixed gas of hydrogen and nitrogen as annealing atmosphere gas according to a conventional method, and the purification annealing can be performed using 100% hydrogen gas to remove impurities.

In the present invention, AlN or MnS precipitates are not used as main grain growth inhibitors, and thus a burden of purification annealing for decomposing and removing AlN or MnS is reduced, and the purification annealing can be sufficiently achieved at a temperature of about 1000° C. or higher. Although the time required for the purification annealing depends on the purification annealing temperature, the purification annealing can be achieved even by homogenization at a temperature of about 1000~1200° C. within about 10 hours, preferably within 1 hour, and in this case, a grain-oriented electrical steel sheet having very excellent magnetic properties can be manufactured.

Hereinafter, the present invention will be described in further detail with reference to examples.

EXAMPLE 1

Slabs comprising C, Si, Mn, S, Al and N in the amounts shown in Table 1 below and the balance of Fe and unavoidable impurities were melted in a vacuum to prepare ingots. Each of the ingots was heated to a temperature of 1250° C., and then hot-rolled to a thickness of 2.3 mm. The hot-rolled steel sheet was annealed by heating it to a temperature of 900° C., and then subjecting it to homogenization heat treatment for 180 seconds. Then, the annealed steel sheet was cooled, pickled, and then cold-rolled to a thickness of 0.30 mm. The cold-rolled steel sheet was subjected to decarburization and recrystallization heat treatment at a temperature of 810° C. for 180 seconds in a mixed gas atmosphere of wet hydrogen and nitrogen. Then, the steel sheet was coated with the annealing separator MgO and finally annealed in a coiled state. In the final annealing, the steel sheet was maintained in a mixed atmosphere of 25% nitrogen +75% hydrogen at a temperature of up to 1200° C., and in a 100% hydrogen gas atmosphere for 1 hour after reaching 1200° C., followed by furnace cooling.

The magnetic properties of the grain-oriented electrical steel sheet were measured as a function of the contents of Mn and S, and the results of the measurement are shown in Table 1 below.

TABLE 1

Changes in magnetic properties of grain-oriented electrical steel sheet as a function of contents of Mn and S

| C (wt %) | Si (wt %) | Mn (wt %) | S (wt %) | Al (wt %) | N (wt %) | Magnetic flux density ($B_{10}$, Tesla) | Core loss ($W_{17/50}$, W/kg) | Remarks |
|---|---|---|---|---|---|---|---|---|
| 0.051 | 3.3 | 0.0020 | 0.001 | 0.0054 | 0.0020 | 1.725 | 1.68 | Comparative material 1 |
| 0.045 | 3.3 | 0.0300 | 0.005 | 0.0032 | 0.0035 | 1.911 | 0.98 | Inventive material 1 |
| 0.062 | 3.3 | 0.0860 | 0.009 | 0.0045 | 0.0029 | 1.823 | 1.43 | Comparative material 2 |
| 0.048 | 3.3 | 0.0012 | 0.012 | 0.0038 | 0.0044 | 1.932 | 0.94 | Inventive material 2 |
| 0.055 | 3.3 | 0.0150 | 0.015 | 0.0052 | 0.0038 | 1.922 | 0.92 | Inventive material 3 |
| 0.052 | 3.3 | 0.0610 | 0.041 | 0.0027 | 0.0041 | 1.935 | 0.90 | Inventive material 4 |
| 0.050 | 3.3 | 0.0440 | 0.035 | 0.0038 | 0.0025 | 1.928 | 0.94 | Inventive material 5 |
| 0.059 | 3.3 | 0.0290 | 0.025 | 0.0028 | 0.0033 | 1.919 | 0.92 | Inventive material 6 |
| 0.651 | 3.3 | 0.0550 | 0.040 | 0.0038 | 0.0037 | 1.944 | 0.92 | Inventive material 7 |
| 0.071 | 3.3 | 0.0530 | 0.038 | 0.0080 | 0.0055 | 1.937 | 0.91 | Inventive material 8 |
| 0.050 | 3.3 | 0.0960 | 0.036 | 0.0063 | 0.0072 | 1.818 | 1.39 | Comparative material 3 |
| 0.048 | 3.3 | 0.0500 | 0.055 | 0.0077 | 0.0060 | 1.786 | 1.72 | Comparative material 4 |
| 0.053 | 3.3 | 0.0500 | 0.065 | 0.0081 | 0.0049 | 1.755 | 1.85 | Comparative material 5 |

As can be seen in Table 1 above, inventive materials 1 to whose S content was limited to the range of 0.002-0.05% according to the present invention were excellent in terms of magnetic flux density and core loss.

FIG. 1(a) is a transmission electron microscope (TEM) photograph of the thickness-directional cross-section of inventive material 3 and shows FeS precipitates in grain boundaries, and FIG. 1(b) is a graph showing the results of analyzing the components of inventive material 3 by EDS (Energy Dispersive Spectroscopy). In the TEM photograph shown in FIG. 1(a), FeS precipitates in grain boundaries were observed, and in the graph shown in FIG. 1(b), the peaks of Fe and S appeared, suggesting that the FeS precipitates acted as grain growth inhibitors.

Comparative material 1 showed poor magnetic properties, because the grain growth inhibitory effect of the grain boundary segregation of elementary S and the use of FeS precipitates were not obtained due to a low S content. Comparative materials 2 and 3 showed high core losses, because MnS precipitates remained due to an Mn content of more than 0.08 wt %, even though the S content was within the range of the present invention. Comparative materials 4 and 5 showed poor magnetic properties, and edge cracks caused by red brittleness red occurred in the hot rolling step, because secondary recrystallized grains were not completely formed due to an S content of more than 0.05 wt %.

EXAMPLE 2

Slabs comprising C, Si, Al and N in the amounts shown in Table 2 below, 0.010 wt % Mn, 0.015 wt % S and the balance of Fe and unavoidable impurities were melted in a vacuum to prepare ingots. Each of the ingots was heated to a temperature of 1250° C., and then hot-rolled to a thickness of 2.3 mm.

The hot-rolled steel sheet was annealed by heating it to a temperature of 1,100° C., and then subjecting it to homogenization heat treatment for 180 seconds. Then, the annealed steel sheet was cooled, pickled, and then cold-rolled to a thickness of 0.30 mm.

The cold-rolled steel sheet was subjected to decarburization and recrystallization heat treatment at a temperature of 830° C. for 180 seconds in a mixed gas atmosphere of wet hydrogen and nitrogen.

Then, the steel sheet was coated with the annealing separator MgO and finally annealed in a coiled state. In the final annealing, the steel sheet was maintained in a mixed atmosphere of 50% nitrogen+50% hydrogen at a temperature up to 1,200° C. and in a 100% hydrogen gas atmosphere for 1 hour after reaching 1,200° C., followed by furnace cooling.

The average size, density and magnetic properties of each of the manufactured grain-oriented electrical steel sheets were measured, and the results of the measurement are shown in Table 2 below. The average size of Al-based oxides was determined by averaging the sizes of Al-based oxides from the longest length and shortest length of the Al-based oxides observed in the thickness-directional cross-section of each steel sheet, and the density of Al-based oxides was determined by calculating the number of Al-based oxides per mm$^2$ in the thickness-directional cross-section of each steel sheet.

TABLE 2

Changes in Al-based oxide density and magnetic properties of grain-oriented electrical steel sheet as a function of contents of components

| C (wt %) | Si (wt %) | Al (wt %) | N (wt %) | Average size of Al-based oxides (μm) | Density of Al-based oxides (number/mm$^2$) | Magnetic flux density ($B_{10}$, Tesla) | Core loss ($W_{17/50}$, W/kg) | Remarks |
|---|---|---|---|---|---|---|---|---|
| 0.062 | 3.25 | 0.0038 | 0.0033 | 1.6 | 165 | 1.922 | 0.94 | Inventive material 9 |
| 0.065 | 3.28 | 0.0052 | 0.0052 | 2.2 | 220 | 1.942 | 0.92 | Inventive material 10 |
| 0.059 | 3.23 | 0.0027 | 0.0027 | 1.2 | 136 | 1.925 | 0.90 | Inventive material 11 |
| 0.067 | 3.27 | 0.0038 | 0.0038 | 1.8 | 178 | 1.918 | 0.94 | Inventive material 12 |
| 0.059 | 3.27 | 0.0028 | 0.0028 | 2.5 | 338 | 1.914 | 0.92 | Inventive material 13 |
| 0.060 | 3.20 | 0.0033 | 0.0033 | 2.1 | 256 | 1.944 | 0.92 | Inventive material 14 |
| 0.068 | 3.25 | 0.0080 | 0.0080 | 1.5 | 155 | 1.937 | 0.91 | Inventive material 15 |
| 0.070 | 3.28 | 0.0115 | 0.0115 | 2.5 | 561 | 1.888 | 1.09 | Comparative material 6 |
| 0.058 | 3.27 | 0.0170 | 0.0039 | 2.8 | 788 | 1.854 | 1.15 | Comparative material 7 |
| 0.068 | 3.27 | 0.0220 | 0.0060 | 3.5 | 1098 | 1.896 | 1.12 | Comparative material 8 |

As can be seen in Table 2 above, in the case of inventive materials 9 to 15 in which the Al content was limited to 0.01 wt % or less and the N content was limited to 0.005 wt % or less, the average size of Al-based oxides formed was 2.5 μm or less, and a low Al-based oxide density of 500/mm$^2$ or less was ensured, suggesting that inventive materials 9 to 15 are excellent in terms of magnetic flux density and core loss.

However, in the case of comparative material 7, in which the content of acid-soluble Al was more than 0.01 wt %, and comparative materials 6 and 8, in which the content of acid-soluble Al was more than 0.01 wt % and the N content was more than 0.005 wt %, these comparative materials had high core losses, because an excessively large number of Al-based oxides were formed in the final steel sheets after secondary recrystallization annealing, interfering with the movement of magnetic walls.

FIG. 2(a) is a scanning electron microscope (SEM) of the thickness-directional cross-section of comparative material 6, and FIG. 2(b) is a graph showing the results of analyzing the steel sheet components of comparative material 6 by EDS (Energy Dispersive Spectroscopy).

In the SEM photograph shown in FIG. 2(a), a large number of large Al oxides were observed in the thickness-directional cross-section of the steel sheet. In addition, in the graph shown in FIG. 2(b), the peaks of Al and O appeared, suggesting that Al oxides such as $Al_2O_3$ remained in the steel sheet.

Figure 2:
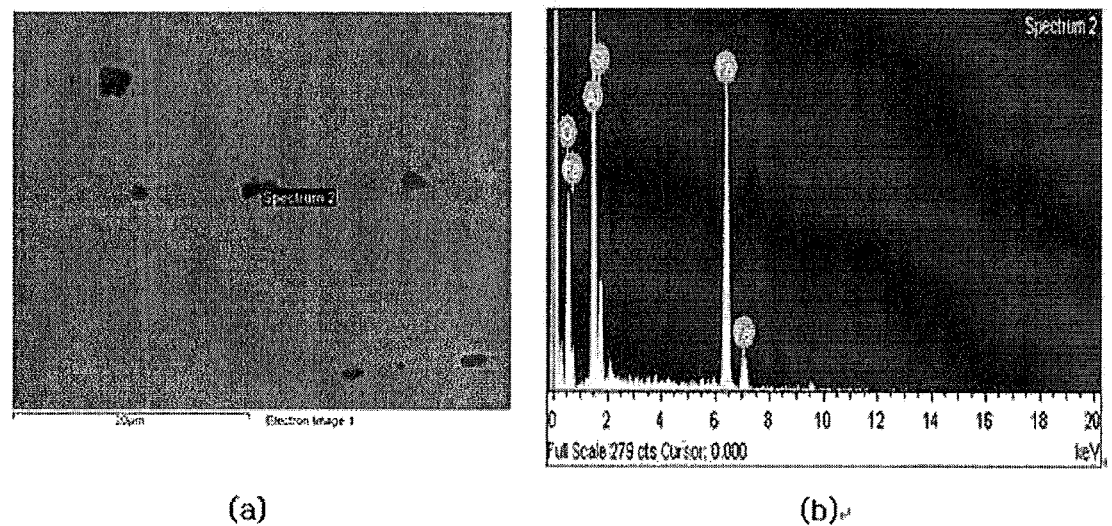
FIG. 2(a) is a scanning electron microscope (SEM) of the thickness-directional cross-section of a steel sheet (comparative material 6 in Table 2) having an Al content higher than 0.01 wt %.
FIG. 2(b) is a graph showing the results of analyzing the components of a steel sheet (comparative material 6 in Table 2) having an Al content higher than 0.01 wt % by EDS (Energy Dispersive Spectroscopy).

From the results shown in Table 2 above and FIG. 2, it can be thought that, when the content of Al is higher than 0.01 wt %, Al-based oxides remaining in the steel sheet will be higher than 500/mm$^2$ and will inhibit the movement of magnetic walls during magnetization of the steel sheet to increase the hysteresis loss (core loss). Thus, in order to manufacture a grain-oriented electrical steel sheet having a significantly decreased hysteresis loss and a very low core loss, the content of Al should be limited to 0.01 wt % or less so that the number of Al-based oxides in the thickness-directional cross-section of the steel sheet is reduced to 500/mm$^2$ or less.

EXAMPLE 3

Slabs comprising C, Si, Al and N in the amounts shown in Table 3 below, 0.020 wt % Mn, 0.020 wt % S and the balance of Fe and unavoidable impurities were melted in a vacuum to prepare ingots. Each of the ingots was heated to a temperature of 1250° C., and then hot-rolled to a thickness of 2.3 mm.

The hot-rolled steel sheet was annealed by heating it to a temperature of 1,100° C., and then subjecting it to homogenization heat treatment at a temperature of 900° C. for 120 seconds. Then, the annealed steel sheet was cooled, pickled, and then cold-rolled to a thickness of 0.30 mm.

The cold-rolled steel sheet was subjected to decarburization and recrystallization heat treatment at a temperature of 850° C. for 180 seconds in a mixed gas atmosphere of wet hydrogen and nitrogen.

Then, the steel sheet was coated with the annealing separator MgO and finally annealed in a coiled state. In the final annealing, the steel sheet was maintained in a mixed atmosphere of 50% nitrogen+50% hydrogen at a temperature up to 1,200° C., and in a 100% hydrogen gas atmosphere for 1 hour after reaching 1,200° C., followed by furnace cooling.

The Al-based oxide density, coercivity and magnetic properties of each of the manufactured grain-oriented electrical steel sheets were measured, and the results of the measurement are shown in Table 3 below.

The Al-based oxide density was determined by calculating the number of Al-based oxides per mm$^2$ in the thickness-directional cross-section of the steel sheet. The coercivity was determined by measuring the applied magnetic field, at which the magnetic flux density of the steel sheet became zero, under an alternating magnetic field of 1.7 Tesla at 50 Hz.

TABLE 3

Changes in Al-based density, coercivity and magnetic properties as a function of Al content

| C (wt %) | Si (wt %) | Al (wt %) | N (wt %) | Density of Al-based oxides (number/mm$^2$) | Coercivity | Magnetic flux density ($B_{10}$, Tesla) | Core loss ($W_{17/50}$, W/kg) | Remarks |
|---|---|---|---|---|---|---|---|---|
| 0.065 | 3.25 | 0.0048 | 0.0033 | 182 | 20.1 | 1.942 | 0.91 | Inventive material 16 |
| 0.065 | 3.28 | 0.0062 | 0.0028 | 252 | 25.4 | 1.912 | 0.95 | Inventive material 17 |
| 0.065 | 3.321 | 0.0037 | 0.0021 | 163 | 18.4 | 1.935 | 0.90 | Inventive material 18 |
| 0.065 | 3.29 | 0.0058 | 0.0025 | 321 | 23.6 | 1.918 | 0.93 | Inventive material 19 |
| 0.065 | 3.28 | 0.0110 | 0.0072 | 655 | 31.0 | 1.902 | 1.09 | Comparative material 9 |
| 0.065 | 3.30 | 0.0170 | 0.0080 | 981 | 35.4 | 1.898 | 1.07 | Comparative material 10 |
| 0.065 | 3.27 | 0.0210 | 0.0075 | 1236 | 39.1 | 1.896 | 1.10 | Comparative material 11 |

As can be seen in Table 3 above, in the case of inventive materials 16 to 19 in which the Al content was limited to 0.01 wt % or less and the N content was limited to 0.005 wt %, these inventive materials had a low Al-based oxide density of 500/mm$^2$ or less, a low coercivity of 30 A/m or less, and excellent magnetic properties.

However, comparative materials 9 to 11 having an acid-soluble Al content of more than 0.01 wt % and a N content of 0.005 wt % had an Al-based oxide density higher than 500/mm$^2$ and poor magnetic properties.

If the content of acid-soluble Al is higher than 0.01 wt %, Al-based oxides will remain in the final steel sheet product after secondary recrystallization annealing and interfere with the movement of magnetic walls under an alternating magnetic field and fix the magnetic walls. In this case, in order to move magnetic walls when a magnetic field changes in the opposite direction, a large amount of force is required to move the magnetic walls fixed by oxides while overcoming the interference of oxides. This force is expressed as coercivity, and greater coercivity means that greater force is required to move magnetic walls under an alternating magnetic field. Thus, higher coercivity indicates higher core loss.

As can be seen from the results in Table 3, inventive materials 16 to 19 having low Al-based oxide densities showed a coercivity of 30 A/m or lower, but in the case of comparative materials 9 to 11, the number of oxides was larger than 500/mm$^2$ so the coercivity was higher than 30 A/m, and thus the core loss was also greatly increased.

The invention claimed is:

1. A method for manufacturing a grain-oriented electrical steel sheet having excellent magnetic properties, the method comprising:
    heating a slab comprising 2.0-4.5 wt % of Si, 0.001-0.10 wt % of C, 0.010 wt % or less of Al, 0.08 wt % or less of Mn, 0.005 wt % or less of N, 0.005-0.050 wt % of S, and the balance of Fe and unavoidable impurities;
    hot-rolling the heated slab;
    subjecting the hot-rolled steel sheet to one cold rolling or two or more cold rollings with intermediate annealing therebetween;
    subjecting the cold-rolled steel sheet to decarburization and recrystallization annealing; and
    subjecting the annealed steel sheet to secondary recrystallization annealing,
    wherein, the secondary recrystallization annealing is performed by heating the decarburized and recrystallized steel sheet to a temperature of at least 1,000° C. to cause secondary recrystallization of the steel sheet, subjecting the secondarily recrystallized steel sheet to homogenization heat treatment at a temperature of 1,000° C. or higher for within 1 hour (excluding 0 hour), and cooling the homogenization heat-treated steel sheet, and
    when subjecting the annealed steel sheet to secondary recrystallization annealing, the secondary recrystallization is caused when at least one of elementary S, which segregates to grain boundaries, and FeS precipitates inhibit grain growth.

2. The method of claim 1, wherein the slab contains 0.05 wt % or less of Mn.

3. The method of claim 1, wherein the density of Al oxides in the thickness-directional cross-section of the secondarily recrystallized steel sheet is 0.1-500/mm$^2$.

4. The method of claim 1, wherein the steel sheet has a coercivity of 30 A/m or less under an alternating magnetic field of 1.7 Tesla at 50 Hz.

5. The method of claim 1, wherein the hot-rolled sheet is annealed after hot rolling, but before cold rolling.

6. The method of claim 2, wherein the density of Al oxides in the thickness-directional cross-section of the secondarily recrystallized steel sheet is 0.1-500/mm$^2$.

7. The method of claim 2, wherein the steel sheet has a coercivity of 30 A/m or less under an alternating magnetic field of 1.7 Tesla at 50 Hz.

8. The method of claim 2, wherein the hot-rolled sheet is annealed after hot rolling, but before cold rolling.

* * * * *